United States Patent [19]

Fulkerson

[11] Patent Number: 4,810,969
[45] Date of Patent: Mar. 7, 1989

[54] HIGH SPEED LOGIC CIRCUIT HAVING FEEDBACK TO PREVENT CURRENT IN THE OUTPUT STAGE

[75] Inventor: David E. Fulkerson, Minnetonka

[73] Assignee: Honeywell Inc., Minneapolis, Minn.

[21] Appl. No.: 179,794

[22] Filed: Apr. 11, 1988

Related U.S. Application Data

[63] Continuation-in-part of Ser. No. 65,479, Jun. 23, 1987, abandoned.

[51] Int. Cl.$^4$ ............................................ H03K 19/017
[52] U.S. Cl. ..................................... 307/448; 307/443; 307/450; 307/548
[58] Field of Search ................ 307/443, 446, 448, 450, 307/475, 540, 546–548, 555, 562, 568, 246, 572, 270

[56] References Cited

U.S. PATENT DOCUMENTS

| | | | |
|---|---|---|---|
| 4,096,398 | 6/1978 | Khaitan | 307/270 X |
| 4,275,313 | 6/1981 | Boll et al. | 307/448 |
| 4,347,447 | 8/1982 | Proebsting | 307/448 X |

FOREIGN PATENT DOCUMENTS 0103232  6/1983  Japan .................................. 307/448

OTHER PUBLICATIONS

Lehovec et al., "Analysis of GaAs FET's for Integrated Logic", *IEEE T.E.L.D.*, vol. ED-27, No. 6, Jun. 1980, pp. 1074–1091.

*Primary Examiner*—David Hudspeth
*Attorney, Agent, or Firm*—Omund R. Dahle

[57] ABSTRACT

An improved FET capacitance driver logic circuit having an inverter feedback stage 22 connected from output to input of output FET 23 to allow the output FET to have a large capacitance charging current surge followed by a reduced conduction thereafter.

17 Claims, 4 Drawing Sheets

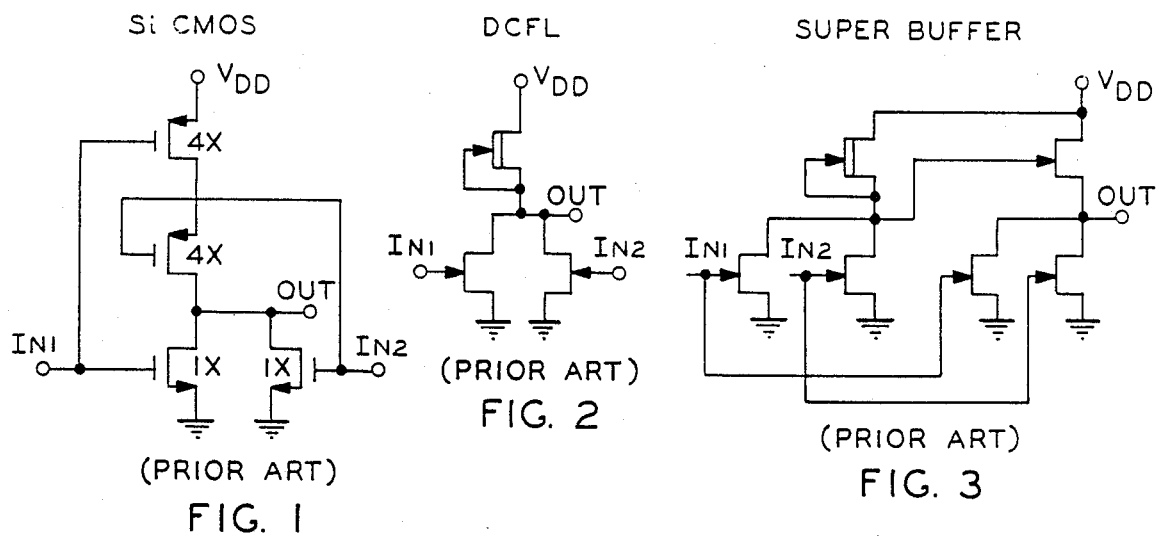
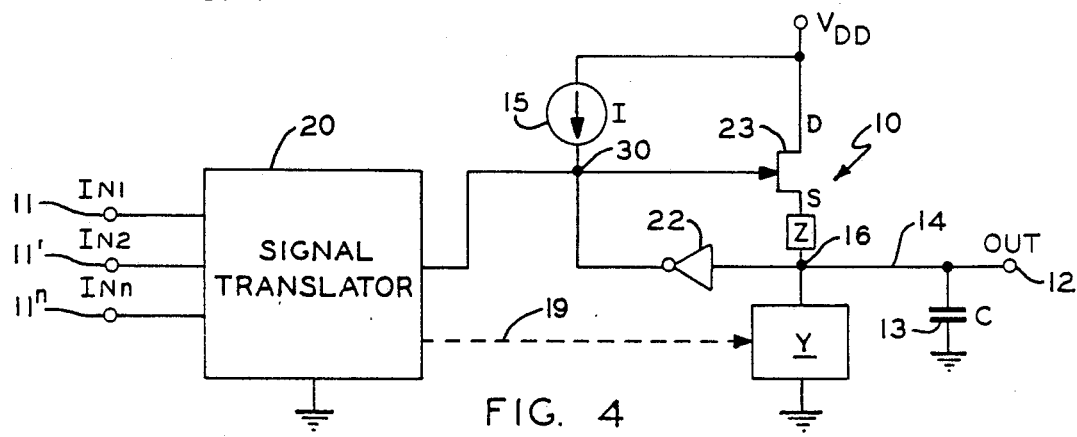
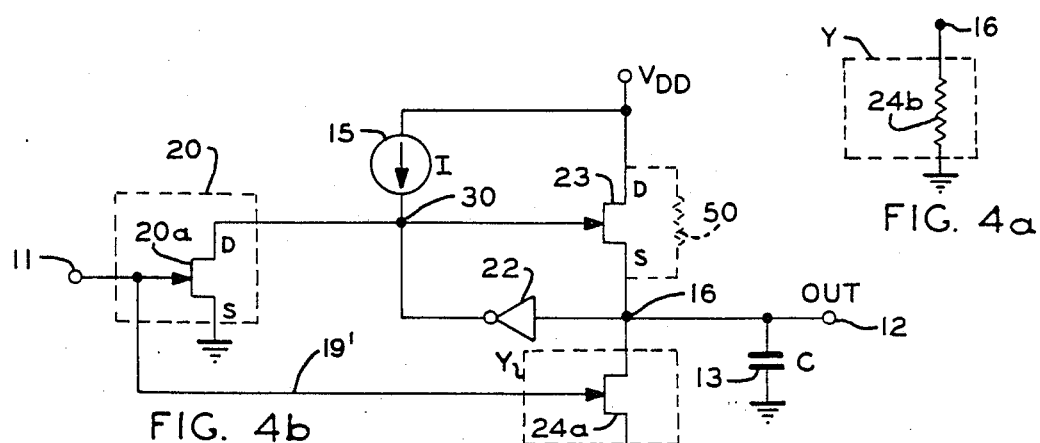
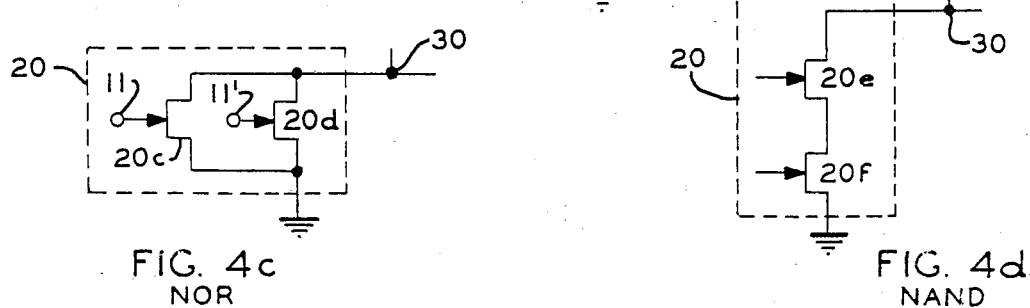

HIGH SPEED LOGIC CIRCUIT HAVING FEEDBACK TO PREVENT CURRENT IN THE OUTPUT STAGE

The present application is a continuation-in-part of the Fulkerson application Ser. No. 65,479, filed June 23, 1987, abandoned.

FIELD OF THE INVENTION

This disclosure is directed to the field of logic design improvements, particularly to the problem of reducing gate delay due to capacitance.

BACKGROUND AND SUMMARY OF THE INVENTION

In the related prior art there have been logic circuit types or families known as Si CMOS, GaAs DCFL and GaAs super buffer; an example of a typical prior Si CMOS being shown schematically in FIG. 1, an example of a typical GaAs DCFL being shown schematically in FIG. 2 and an example of a typical prior art GaAs super buffer being shown in FIG. 3.

In the present invention the generalized circuit or conceptual diagram is shown in FIG. 4 to be followed by specific circuit embodiments. Some of the advantages of the present invention over the previously known circuits include:

the new circuit is faster than Si MOS or GaAs DCFL it has a higher noise margin than GaAs DCFL the power is lower than in a super-buffer this circuit drives high capacitance much faster and at lower power than DCFL or other circuits that don't turn off after the output transition (i.e., the capacitance charging current is relatively large and this current nearly turns off after output is "high", thus saving power)

unlike CMOS, only one type of transistor (enhancement mode) is needed for some embodiments of the invention.

BRIEF DESCRIPTION OF THE DRAWINGS

FIGS. 1, 2 and 3 are schematic circuit representations of related prior art circuits.

DESCRIPTION

Figure 4E:
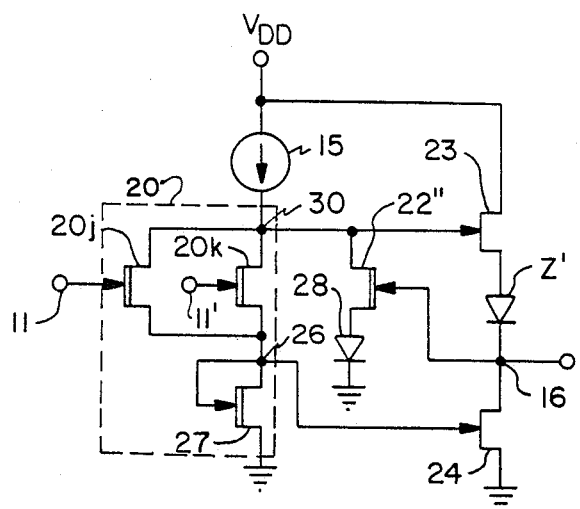
FIG. 4 is a generalized circuit diagram showing the invention and FIGS. 4a, 4b, 4c, 4d and are variations of FIG. 4.

Referring now generally to FIG. 4 there is shown a simplified schematic of a FET logic circuit 10 having one or more input terminals 11, 11', ... 11n and an output terminal 12. Specifically it is intended as an improved capacitance driver logic circuit with Si, GaAs, or other semiconductor FET's. In the high speed Si and GaAs VLSI technologies (e.g. 0.2 mW, 150° C., 1 geometries) the interconnects 14 between logic stages and other logic stages connected to the output each inherently present a troublesome parasitic capacitance 13 to the circuit 10, the magnitude of which may be in the order of $200 \times 10^{-15}$ farads, for example. The capacitance 13 is responsible for gate delays thus limiting the response time of the overall logic system. Referring again to FIG. 4, a voltage source $V_{DD}$ is connected through the drain-source circuit of a FET 23, impedance means Z, a junction 16, and an output interconnect 14 to the output 12. The parasitic capacitance 13 exists between output 12 and ground. The transistor 23 operates as a "pull-up" device for output 12. The junction 16 is also connected through a voltage pull-down circuit Y to a voltage reference or ground. The circuit Y may take several forms, passive or active as will be described later. The impedance means Z could be an impedance or voltage shift circuit, a diode means or a short circuit. A current means (resistor, transistor, etc.) 15 supplies current to a junction 30 which is connected to the gate electrode of FET 23. A signal translator 20, which may take several forms, interconnects the signal input 11 in controlling relation with the gate electrode of FET 23. A most important additional feature of the circuit is an inverter means 22 coupled from junction 16 to the gate of FET 23. A dashed line 19 interconnects signal translator 20 to the pull-down circuit Y when Y is an active device.

The purpose of this invention is to minimize the delay effect of the capacitance 13 while maintaining a low power level. This is accomplished by allowing FET 23 to rapidly charge C and then to essentially turn off 23 after the output is high. In FIG. 4a the pull-down means Y is shown as a passive resistor 24b connected between junction 16 and ground. In FIG. 4b is shown another embodiment of FIG. 4 in which the pull-down means Y is shown as a FET 24a. FET 24a has its source-drain circuit connected between junction 16 and ground. FIG. 4b also shows signal translator 20 in the form of a FET 20a in which the drain-source circuit is connected from junction 30 to ground. The FET 20a has its gate directly connected to input 11. Input 11 is also connected to the gate of FET 24a. The output circuits of FETs 23 and 24a are serially connected so that a circuit path can be traced from source VDD through FET 23 from drain to source, output junction 16, from drain to source of FET 24a, the source electrode being connected to a voltage reference or ground. In another variation a resistance 50 is connected in parallel with FET 23. The junction 16 is also connected to the input of inverter 22, the output of which is connected to the gate of FET 23.

In FIG. 4c in another embodiment the signal translator 20 is shown in a NOR arrangement having a pair of inputs 11 and 11', connected to the gate electrodes of FETs 20c and 20d. FIG. 4d shows the signal translator 20 connected as a NAND arrangement in which FETs 20e and 20f are connected in series between junction 30 and ground. FIG. 4e shows another embodiment of a NOR logic gate. A pair of inputs 11 and 11', are connected to the gate electrodes of depletion mode FET's 20j and 20k. The drain electrodes are connected to terminal 30 and the source electrodes are connected to ground through a junction 26 and a depletion mode FET 27 connected to provide an impedance to junction 26. The junction 26 is connected to the gate electrode of FET 24. When one of the input transistors is conducting, the voltage developed at junction 26 is effective to turn on pull-down FET 24. In this embodiment the impedance element Z between FET 23 and junction 16 is shown in the form of a diode Z'. Also the inverter 22 is shown as a depletion mode FET 22" and diode 28. The diode 28 connects the FET 22" to ground.

Figure 4F:
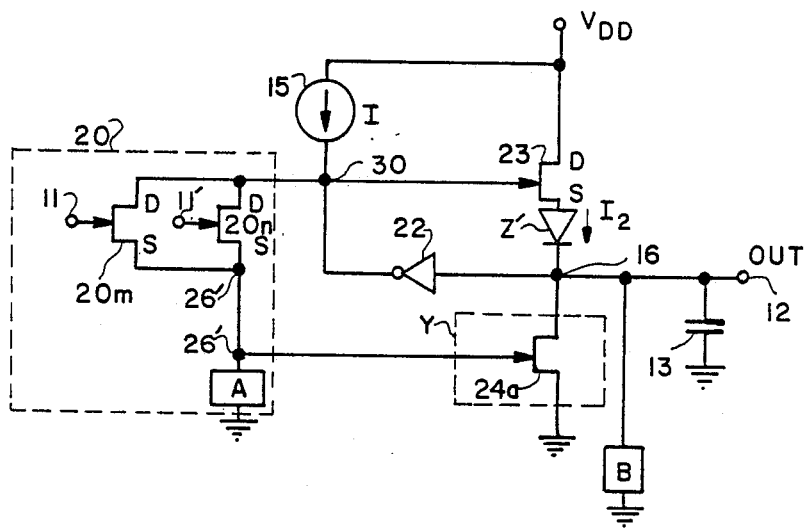

A presently most preferred embodiment of FIG. 4 is shown in FIGS. 4f, g and i. Referring to FIG. 4f there is disclosed a logic circuit having two input terminals 11 and 11' connected to the gate electrodes of FETs 20m and 20n. The circuit includes a plurality of FETs 20m, 20n, 23, 24a, 27' (when variation 4g is used), and 22' (when the inverter of FIG. 4i is used). Input 11 is connected to the gate electrode of FET 20m. Input 11' is connected to the gate electrode of FET 20n. The source electrode of FETs 20m and 20n is connected to a terminal 26' and then through an impedance element A to ground. Terminal 26' is also connected to the gate electrode of a FET 24a. The drain electrode of FETs 20m and 20n is connected to the output terminal 30 of current means 15. When one of the FETs 20m and 20n is conducting the resulting voltage at 26' developed across impedance A is sufficient to turn on pull-down FET 24a. As earlier described the voltage source $V_{DD}$ is connected through the drain-source circuit of FET 23, the impedance shown as diode means Z', the junction 16, and the drain-source of FET 24a to ground. An impedance B is also shown in parallel with FET 24a from junction 16 to ground.

Figure 4G:
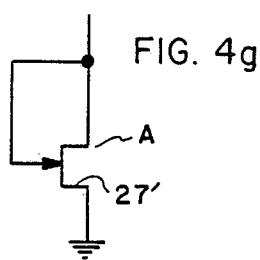
Figure 4I:
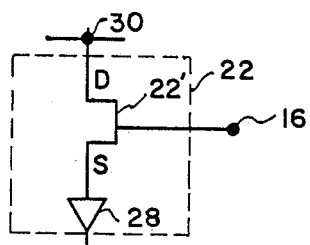
Figure 4K:
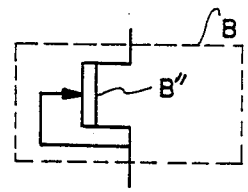
Figure 4H:
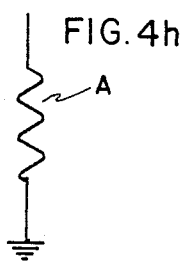
Figure 4J:
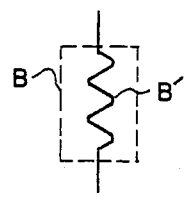

In FIG. 4g the impedance A of FIG. 4f is shown in the form of a diode connected FET 27, The impedance A may also take the form of a resistance as shown in FIG. 4h. In FIG. 4i, the inverter 22 shown more generally in FIG. 4f is shown as a FET 22' and diode means 28 in which the junction 16 is connected to the gate of FET 22', the drain being connected to terminal 30 and the gate of 23, and the source being connected to ground by way of diode 28. In FIG. 4j the impedance B of FIG. 4f is shown as a resistor B, while in FIG. 4k the impedance B is shown as a diode-connected depletion FET B".

In this preferred embodiment of FIG. 4f, with 4g and 4i the operation is as follows; assume an initial condition in which inputs 11 and 11' are low so that FETs 20m and 20n are "off". No current then flows from the current source 15 through these FETs 20m and 20n and only a small potential exists across impedance A so that FET 24a is also "off". In this initial condition the FET 23 was first highly conductive by the bias from current source 15 and rapidly charged the capacitance 13, the output voltage rising rapidly. The inverter 22, actually FET 22' and diode 28, are initially nonconductive and provide a high impedance between terminal 30 and ground, however as the output voltage rises rapidly a threshold voltage is reached at which FET 22' and diode 28 (i.e., the inverter) become conductive and carry the current from current source 15 through the drain-source of FET 22' and diode means 28 to ground. The result is that the voltage at 16 is limited, the previously highly conductive voltage pull-up FET 23 now becomes substantially nonconductive supplying only the current needed by the impedance B, and any output load current. The only FET conducting any substantial amount of current at this point is the inverter FET 22'. Thus the circuit is effective to initially fully turn on FET 23 to provide a rapidly rising output voltage, quickly charging the parasitic capacitance 13 and reducing the gate delay; and then by the action of inverter circuit 22 turning off (substantially) the FET 23.

Assume input 11 or 11' goes high so that one of FETs 20m and 20n are on. The resulting voltage drop across impedance A is effective to also turn on FET 24a. With one of these FETs 20m and 20n conducting it is effective to sink all of the current I so that the voltage at 30 is low. FET 23 is thus biased off and $I_2$ is zero or nearly so. Conductive FET 24a rapidly discharges the capacity 13 reducing the output potential at 16, 12 to a low value. The conductive FET 24a has to sink virtually no current subsequent to initially discharging capacitance 13. The output at 12 is low.

Figure 5:
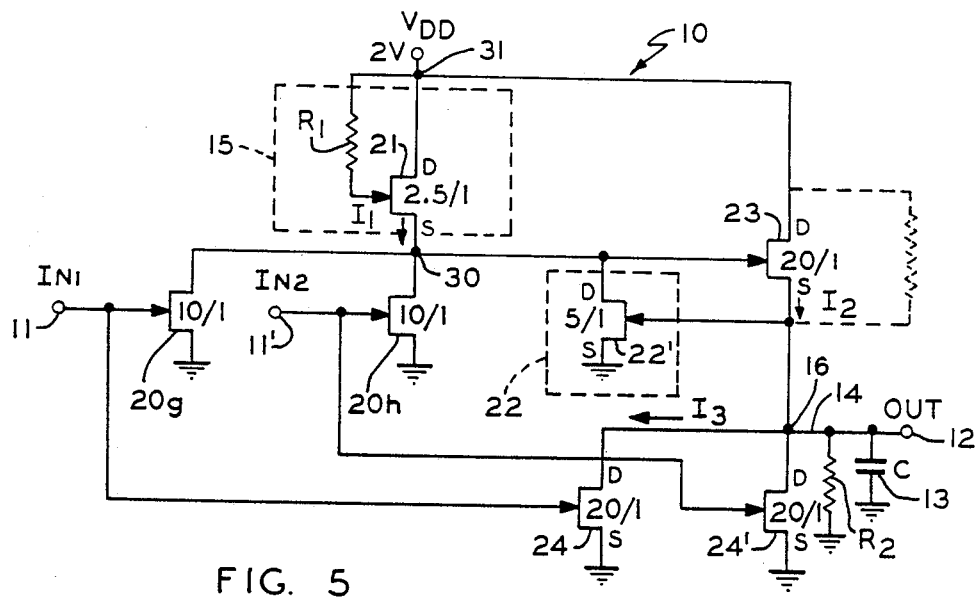
FIG. 5 is a circuit schematic of a specific embodiment according to the invention.
Figure 5A:
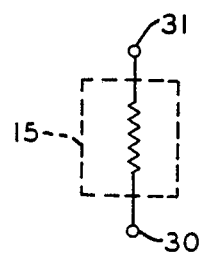
FIGS. 5a, 5b and 5c are variations of a first portion of FIG. 5
Figure 5B:
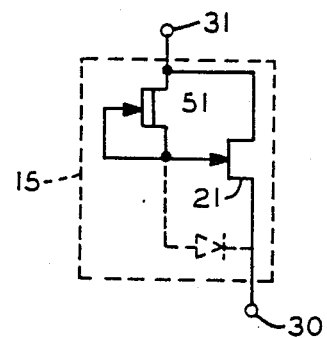
Figure 5C:
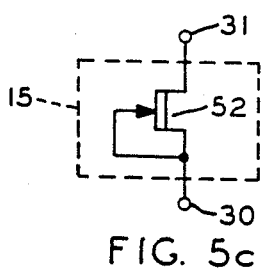

A specific embodiment of the general circuit of FIG. 4 is shown in FIG. 5. The same numbering is used in both figures where applicable. Referring now to FIG. 5 there is disclosed a logic circuit having two input terminals 11 and 11', and an output terminal 12. The circuit includes a number of enhancement type GaAs FETs 20g, 20h, 21, 22', 23, 24 and 24'. Input 11 is connected to the gate of FETs 20g and 24. Input 11' is connected to the gate of FETs 20h and 24'. The source electrode of FETs 20g, 20h, 22', 24 and 24' is connected to ground. The drain electrodes of FETs 20g and 20h are connected to a lower terminal 30 of current means 15. In this embodiment the current means 15 is shown in the form of enhancement type FET 21, the source electrode of which is connected to terminal 30 and the drain electrode of which is connected by junction 31 to a voltage supply $V_{DD}$, which voltage may be 2 volts, for example. The gate electrode of FET 21 is connected to the drain electrode through a biasing resistor $R_1$. $R_1$ may have a resistance on the order of 100K ohms, for example. The current means provides a current $I_1$ at terminal 30. The current means 15 may take other forms such as is shown in FIG. 5a, 5b or 5c.

A circuit path can also be traced from the voltage supply terminal 31 through FET 23 output circuit from drain to source, junction 16 (and thus by interconnect 14 to output 12), and a resistor $R_2$ to ground. Resistor $R_2$ may have a resistance on the order of 100K ohms, for example. In parallel with resistor $R_2$ is the capacitance 13, previously discussed. Also in parallel with resistor $R_2$ is the output circuit of FET 24 and also the output circuit of FET 24'. Thus a circuit path can be traced from junction 16 to the drain electrode of both FETs 24 and 24', their source electrodes being grounded as previously mentioned. The inverter 22 is an enhancement FET 22' having its gate connected to junction 16, its drain connected to the gate of FET 23 and its source electrode grounded. The resistor $R_2$ may take on alternate form such as the transistor shown in FIG. 5d.

The logic circuit 10 of FIG. 5 operates substantially as follows. (Please refer to FIG. 6 for waveforms.) The transistor 21 forms a current means, with current $I_1$ at terminal 30 given approximately by $$I_1 = K'(V_D - V_T)^2 + I_{R1}$$

where $V_D$ is the gate-to-source diode voltage, $V_T$ is the threshold voltage, $K'$ is the gain and $I_{R1}$ is the current through biasing resistor $R_1$. The abovementioned gate-to-source diode is inherent in GaAs FETs.

Assume input 11' is low (0) and FETs 20h and 24' are off throughout this explanation. Assume input 11 is high (1) and FETs 20g and 24 are on (time $t_1$). With FET 20g conducting it is effective to sink all of the current $I_1$ so that the voltage at 30 is low. FET 23 is thus not conducting and $I_2$ is zero or nearly zero, thus "on" transistor 24 has to sink virtually no current subsequent to initially discharging capacitance 13. The output at 12 is low.

Assume input 11 goes low (0), and as FETs 20g and 24 are turning off the FET 23 turns on full (time $t_2$). The low impedance output circuit of FET 23 allows a high current to flow initially while charging the capacitance 13 as the output 12 is going high. During the initial time period as FET 23 turns on the FET 22' is off. As long as the output voltage is lower than the threshold voltage necessary to turn FET 22' on, the FET 23 is free to provide as much current into capacitance 13 as it is capable of delivering. As the charging continues and the output voltage rises to the threshold, the FET 22' becomes conductive and sinks the current $I_1$. The output voltage at 12 (or 16) will only be allowed to rise high enough to allow FET 22' to sink essentially all of the current $I_1$. At this point the gate bias at FET 23 reduces the current $I_2$ through the FET to near zero to supply only enough d.c. current to drive the resistance $R_2$ and the small gate current required by FET 22' and the output loads. Assume input 11 now goes high (time $t_3$) and FETs 20 and 24 turn on. Conductive FET 20g again sinks the current $I_1$, the voltage at 30 is low, FET 23 turns off, $I_2$ goes to zero, current pulse $I_3$ flows through FET 24 to discharge capacitance 13 and output 12 is low.

Figure 6:
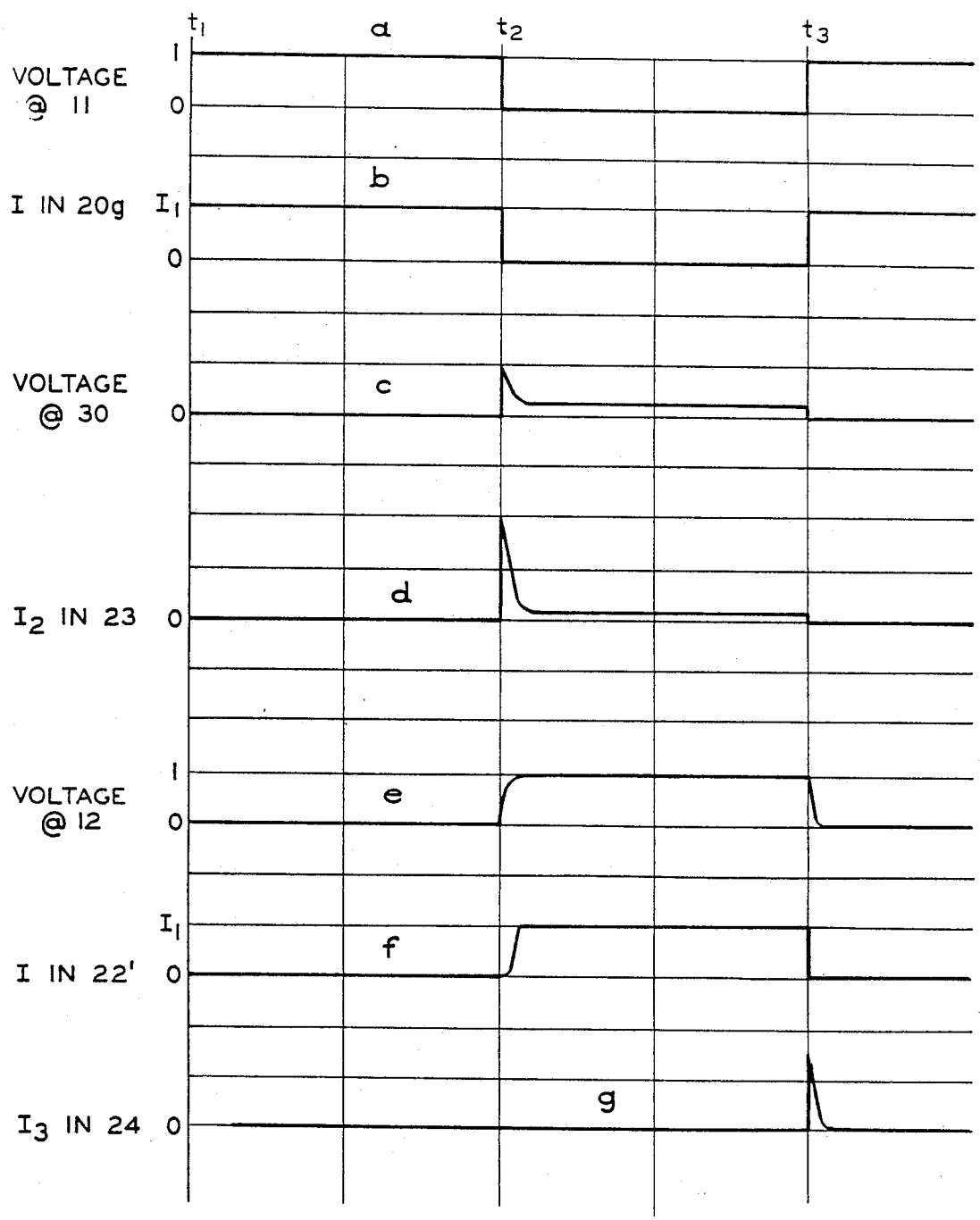
FIG. 6 is a graphical presentation of several waveforms in the operating circuit.

In FIG. 6 the curves a-g show the approximate waveforms of voltage and current at various points of the circuit as described above. Curve a is the voltage at signal input terminal 11. Curve b is the waveform of current flowing through FET 20g. Curve c is a voltage waveform of the voltage at terminal 30 and the gate of FET 23. Curve d is a current waveform of the current $I_2$ flowing through FET 23. Curve e is a voltage waveform at output terminal 12. Curve f is a current waveform of the current flowing through FET 22'. Curve g is a current waveform of current flowing through FET 24.

The FETs 20, 20', 22', 21, 23, 24 and 24' have been previously described as being enhancement type FETs; however, as shown in FIG. 5 they need not all be exactly identical in size. FET 21 is shown as having channel length/width dimensions in microns of 2.5/1; FETs 20 and 20' having dimensions of 10/1; FETs 24, 24' and 23 having dimensions of 20/1; and FET 22' having dimensions of 5/1. These various FETs can be modified as desired.

Figure 5D:
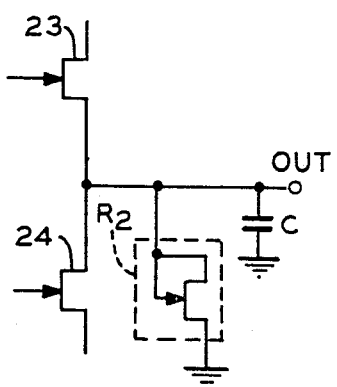
FIG. 5d is a variation of a second portion of FIG. 5.

With this integrated circuit the current means 15 may take other forms than that shown in FIG. 5 and several typical variations are shown in FIGS. 5a, 5b and 5c. In FIG. 5a a resistance is shown; in FIG. 5b a depletion mode FET 51 provides the bias current for the FET 21; and in FIG. 5c a depletion mode FET 52 is shown. Also the resistance R2 shown in FIG. 5 may take other forms and one such modification is shown in FIG. 5d.

The inverter means 22 has been several times recited as being coupled or connected from junction 16 to the gate of FET 23, so that the initially full on FET 23 (at time $t_2$) can be cut back by inverter means 22 as soon as the output voltage (at 12 and 16) reaches the desired level, in this case the threshold voltage of FET 22'. The important function is that the signal of the inverter means is coupled to cut back the conduction of FET 23 and this coupling may include a more indirect circuit route as well as the direct connection to the gate which is shown.

The embodiments of the invention in which an exclusive property or right is claimed are defined as follows:

1. A FET capacitance driver logic circuit subject to capacitance of a logic output terminal, which capacitance tends to delay switching time at the logic output terminal, the circuit comprising:
   a plurality of enhancement type FETs, each having a gate electrode and drain and source output electrodes; a first of said FETs having its output electrodes interconnecting a source of voltage and an output terminal;
   a second of said FETs having its output electrodes interconnecting said output terminal and a voltage reference;
   a current means having terminals including an output terminal, said output terminal being connected to the gate electrode of said first FET;
   a third of said FETs having its output electrodes interconnecting said current means output terminal and said reference, said second and third FET each having its gate electrode for connection to a signal source for controlling the conductivity of said second and third FET; and,
   a fourth of said FETs having its output electrodes interconnecting said current means terminal and said reference, said fourth FET having its gate electrode connected to said output terminal.

2. The circuit according to claim 1 and further comprising a resistance $R_2$ connected between said output terminal and said reference.

3. The circuit according to claim 1 in which said current means comprises a fifth of said FETs having its output electrodes connected in circuit with said current means terminal.

4. The circuit according to claim 1 in which said capacitance has a value on the order of $200 \times 10^{-15}$ farads.

5. The circuit according to claim 2 in which said resistance has a value on the order of 100K ohms.

6. The circuit according to claim 1 in which said first FET and said second FET have a channel width/length dimension in microns on the order of 20/1, said third FET has a channel width/length dimension in microns on the order of 10/1, and said fourth FET having a channel width/length dimension in microns on the order of 5/1.

7. A FET capacitance driver logic circuit subject to an inherent capacitance of a logic output terminal, which capacitance tends to delay switching time at the logic output terminal, the circuit comprising:
   a first power terminal for energization by a source of potential;
   first and second enhancement type GaAs FETs each having a source electrode, a drain electrode and a gate electrode, the first FET drain electrode being connected to said first power terminal, said first FET source terminal being connected to a logic output terminal and to the drain electrode of said second FET, the source electrode of said second FET being connected to a voltage reference;
   a third enhancement type GaAs FET having its gate electrode connected to said first FET source electrode, its drain electrode connected to said first FET gate electrode and its source electrode connected to said reference;
   a fourth enhancement type GaAs FET having its gate electrode connected to a signal input terminal and to the gate electrode of said second FET, its source electrode connected to said reference and having a drain electrode;
   a current means having terminals including an output terminal connected to said first FET gate electrode, said third FET drain electrode and said fourth FET drain electrode;

and a resistance connected between said logic output and said reference.

8. The circuit according to claim 7 in which said current means comprises a fifth enhancement type GaAs FET having its output terminals connected in circuit with said current means terminal.

9. The circuit according to claim 7 in which said capacitance has a value on the order of $200 \times 10^{-15}$ farads.

10. The circuit according to claim 7 in which resistance has a value on the order of 100K ohms.

11. The circuit according to claim 7 in which said first FET and said second FET have a channel width/length dimension in microns on the order of 20/1, said third FET has a channel width/length dimension in microns on the order of 5/1, and said fourth FET having a channel width/length dimension in microns on the order of 10/1.

12. A FET logic circuit, the circuit comprising:
a first FET having a gate electrode and an output circuit comprising drain and source electrodes; output circuit means comprising said output circuit interconnecting a source of voltage and a logic output terminal, said first FET when conductive operating as a voltage pull-up device for said output terminal;
a second FET having a gate electrode and output electrodes comprising drain and source electrodes, said output electrodes interconnecting said logic output terminal and a voltage reference;
current means having terminals including an output terminal, said current means output terminal being connected to the gate electrode of said first FET;
a third FET having a gate electrode and output electrodes comprising drain and source electrodes, said FET having its output electrodes and a serially connected impedance means interconnecting said current means output terminal and said reference, said impedance means being between said voltage reference and said FET, said third FET having its gate electrode for connection to a signal source for controlling the conductivity of said third FET;
connection means from the gate electrode of said second FET to said impedance means; and,
inverter means having a control terminal and output terminals, said control terminal being connected to said logic output terminal to sense the voltage level at said logic output terminal, said inverter means having one of its output terminals coupled to said first FET gate electrode and the other of its output terminals to said voltage reference, said inverter means having a sensed voltage threshold at said control terminal at which said inverter means couples to said first FET gate electrode a signal to limit the pull-up to said threshold level.

13. The circuit according to claim 12 and further comprising in said output circuit means diode means serially connected with said first FET output circuit, said diode means being between said logic output terminal and said first FET.

14. A FET capacitance driver logic circuit subject to capacitance of a logic output terminal, which capacitance tends to delay switching time at the logic output terminal, the circuit comprising:
a plurality of FETs, each having a gate electrode and drain and source output electrodes; a first of said FETs having its output electrodes and a serially connected first diode means interconnecting a source of voltage and a logic output terminal, said diode means being between said logic output terminal and said FET;
a second of said FETs having its output electrodes interconnecting said output terminal and a voltage reference;
a current means having terminals including an output terminal, said current means output terminal being connected to the gate electrode of said first FET;
a third of said FETs having its output electrodes and a serially connected impedance means interconnecting said current means output terminal and said reference, said impedance means being between said voltage reference and said FET, said third FET having its gate electrode for connection to a signal source for controlling the conductivity of said third FET;
connection means from the gate electrode of said second FET to said impedance means; and,
a fourth of said FETs having its output electrodes and a serially connected second diode means interconnecting said current means terminal and said voltage reference, said second diode means being between said voltage reference and said FET, said fourth FET having its gate electrode connected to said logic output terminal.

15. The FET capacitance driver logic circuit according to claim 14 and further comprising:
a fifth of said enhancement type FETs having its output electrodes connected in parallel with the output electrodes of said third FET, said fifth FET having its gate electrode for connection to another signal source for controlling the conductivity of said fifth FET, said impedance means thus being in series with the paralleled output electrodes of said third and fifth FETs.

16. A FET capacitance driver logic circuit subject to an inherent capacitance of a logic output terminal, which capacitance tends to delay switching time at the logic output terminal, the circuit comprising:
a first power terminal for energization by a source of potential;
a diode;
first and second GaAs FETs each having a source electrode, a drain electrode and a gate electrode, the first FET drain electrode being connected to said first power terminal, said first FET source terminal being connected through said diode to a logic output terminal and to the drain electrode of said second FET, the source electrode of said second FET being connected to a voltage reference;
a third GaAs FET having its gate electrode connected to said logic output terminal, its drain electrode connected to said first FET gate electrode and its source electrode connected by way of a second diode to said reference;
impedance means;
a fourth GaAs FET having its gate electrode connected to a signal input terminal, its source electrode connected to said reference by way of said impedance means and having a drain electrode;
the gate electrode of said second FET being connected to said impedance means;
a current means having terminals including an output terminal connected to said first FET gate electrode, said third FET drain electrode and said fourth FET drain electrode;

and a second impedance means connected between said logic output terminal and said reference.

17. The FET capacitance driver logic circuit according to claim 16 and further comprising:
a fifth enhancement type FET having its source and drain electrodes connected in parallel with the source and drain electrodes of said fourth FET, said fifth FET having its gate electrode for connection to another signal input source for controlling the conductivity of said fifth FET, said impedance means thus being in series with the paralleled source and drain electrodes of said fourth and fifth FETs.

* * * * *